United States Patent
Tendulkar

(10) Patent No.: US 9,178,142 B2
(45) Date of Patent: Nov. 3, 2015

(54) DOPED ELECTRODES USED TO INHIBIT OXYGEN LOSS IN RERAM DEVICE

(71) Applicant: Intermolecular Inc., San Jose, CA (US)

(72) Inventor: Mihir Tendulkar, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 152 days.

(21) Appl. No.: 13/784,465

(22) Filed: Mar. 4, 2013

(65) Prior Publication Data

US 2014/0246640 A1    Sep. 4, 2014

(51) Int. Cl.
*H01L 45/00* (2006.01)
*H01L 29/06* (2006.01)
*H01L 27/22* (2006.01)
*H01L 27/24* (2006.01)

(52) U.S. Cl.
CPC ............ *H01L 45/1253* (2013.01); *H01L 45/08* (2013.01); *H01L 45/1233* (2013.01); *H01L 45/146* (2013.01); *H01L 45/16* (2013.01); *H01L 45/1616* (2013.01); *H01L 27/224* (2013.01); *H01L 27/2463* (2013.01)

(58) Field of Classification Search
None
See application file for complete search history.

(56) References Cited

U.S. PATENT DOCUMENTS

| 5,383,088 | A | 1/1995 | Chapple-Sokol et al. |
| 7,067,422 | B2 | 6/2006 | Nakamura et al. |
| 7,067,862 | B2 | 6/2006 | Rinerson et al. |
| 7,473,640 | B2 | 1/2009 | Conley, Jr. |
| 7,538,338 | B2 | 5/2009 | Rinerson et al. |
| 8,115,282 | B2 | 2/2012 | Mege |
| 2004/0159828 | A1* | 8/2004 | Rinerson et al. .................. 257/2 |
| 2005/0092983 | A1* | 5/2005 | Lyons et al. .................. 257/40 |
| 2006/0050598 | A1* | 3/2006 | Rinerson et al. ............. 365/232 |
| 2012/0295398 | A1* | 11/2012 | Kurunczi et al. ............. 438/104 |
| 2013/0228736 | A1* | 9/2013 | Matsushita et al. ............... 257/4 |
| 2014/0175360 | A1* | 6/2014 | Tendulkar et al. ............... 257/4 |

FOREIGN PATENT DOCUMENTS

JP    2005175457 A    6/2005

OTHER PUBLICATIONS

Stumpf et al. Reduced oxygen diffusion through beryllium doped platinum electrodes. Sep. 6, 1999. Applied Physics Letters. vol. 75, No. 10. pp. 1389-1391.*

Seo, S., et al.; Electrode dependence of resistance switching in polycrystalline NiO films; Jan. 1, 2005; American Institute of Physics; Applied Physics Letters 87 263507 2005.

Park, Jae-Wan., et al.; Influence of Oxygen Content on Electrical Properties of NiO Films Grown by Rf Reactive Sputtering for Resistive RandomAccess Memory Applications; Jan. 1, 2006; Academia—Hanyang University; Journal of Vacuum Science and Technology A. 23 5m oo 22052208.

(Continued)

*Primary Examiner* — Hoang-Quan Ho

(57) ABSTRACT

A nonvolatile memory device and method for forming a resistive switching memory element, with improved lifetime and switching performance. A nonvolatile memory element includes resistive switching layer formed between a first and second electrode. The resistive switching layer comprises a metal oxide. One or more electrodes include a dopant material to provide the electrode with enhanced oxygen-blocking properties that maintain and control the oxygen ion content within the memory element contributing to increased device lifetime and performance.

16 Claims, 6 Drawing Sheets

(56) References Cited

OTHER PUBLICATIONS

Stumpf, R., et al.; Reduced Oxygen Diffusion Through Beryllium Doped Platinum Electrodes; Sep. 6, 1999; American Institute of Physics; Applied Physics Letters vol. 75 No. 10 pp. 13891391.

H.C. Wen et al.; Systematic Investigation of Amorphous TransitionMetalSiliconNitride Electrodes for Metal Gate CMOS Applications; Jan. 1, 2005; 2005 Symposium on VLSI Technology Digest of Technical Papers; Unknown.

* cited by examiner

DOPED ELECTRODES USED TO INHIBIT OXYGEN LOSS IN RERAM DEVICE

FIELD OF THE INVENTION

This invention relates to nonvolatile memory elements, and more particularly, to methods for forming resistive switching memory elements used in nonvolatile memory devices.

DESCRIPTION OF THE RELATED ART

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

It is believed that conventional films used to form resistive switching layers in resistive switching nonvolatile memory provide a reversible creation/dissolution of a conductive filament through the resistive switching material between two layers serving as electrodes. Furthermore, it is believed that conductive filament is enabled by oxygen vacancy generation and motion within the resistive switching material. The physical and chemical properties of the resistive switching materials determine the amount of power needed to switch the resistance states of such films.

As the device size continues to shrink and the thickness of the resistive switching film continues to scale ever thinner with the device size, any contamination or otherwise alteration of the properties of the resistive switching film effects the endurance lifecycle of the device and its data retention capability. Typical resistive switching film materials contain oxygen ions and, in addition, typical electrode materials are oxygen permeable and therefore any loss of oxygen content from the resistive switching film contributes to the limited life of the device. It is believed that oxygen loss occurs from the metal oxide layer through hot spots in the electrodes generated by currents during forming and programming/switching operations.

There is a need to improve data retention and device lifetime by maintaining the oxygen content within the device structure by limiting and/or minimizing the loss of the oxygen content within the memory element and prevent the diffusion of oxygen from the resistive switching film through the electrodes.

SUMMARY OF THE INVENTION

Embodiments described provide for a resistive switching nonvolatile memory element with an electrode doped with dopant materials that provide the electrode with enhanced oxygen ion diffusion blocking properties which prevent the diffusion of oxygen ions from a metal oxide layer into and through the electrode. The enhanced oxygen diffusion blocking properties in the electrode results in a device structure that provides longer data retention and better endurance than nonvolatile memory elements whose electrodes have not been so doped.

In some embodiments, a nonvolatile memory element includes a first electrode layer, a second electrode layer and a resistive switching layer disposed between the first electrode layer and the second electrode layer. One or more of the electrodes comprises a dopant.

In some embodiments, the method of forming a nonvolatile memory element in a ReRAM device includes forming a resistive switching layer over a first electrode layer, forming a second electrode layer, so that the resistive switching layer is disposed between the first electrode layer and the second electrode layer. One or more of the electrodes comprises a dopant.

BRIEF DESCRIPTION OF THE DRAWINGS

So that the manner in which the above recited features can be understood in detail, a more particular description may be had by reference to embodiments, some of which are illustrated in the appended drawings. It is to be noted, however, that the appended drawings illustrate only typical embodiments and are therefore not to be considered limiting of its scope, and may admit to other equally effective embodiments.

While the foregoing description is directed to particular embodiments, other and further embodiments may be devised without departing from the basic scope thereof, and the scope thereof is determined by the claims that follow.

DETAILED DESCRIPTION

Embodiments according to the invention generally include a method of forming a nonvolatile memory device that contains a resistive switching memory element that has an improved device switching performance and an increased usable lifetime. Embodiments provide a metal-insulator-metal (MIM) stack structure that maintains and controls the localized oxygen content and location over the lifetime of the device. It is noted that relative directional terms used herein with regard to embodiments described are for purposes of description only, and do not limit its configuration as would be understood by a person skilled in the art. Specifically, directional terms such as "over," "above," "under," and the like are used under the assumption that substrate 201 on which embodiments are formed is a "bottom" element and is therefore "under" elements of the structures formed thereon.

In some embodiments, a nonvolatile memory element includes a resistive switching layer formed between a first metal electrode layer and a second metal electrode layer. At least one electrode layer is doped with a dopant material so as to inhibit oxygen diffusion within the MIM device in a particular direction. For example, typical electrode materials such as titanium nitride (TiN), tantalum nitride (TaN), platinum (Pt), gold (Au), ruthenium (Ru), iridium (Ir), among others may include a dopant material such as beryllium (Be). For example, beryllium binds with the base material along the grain boundaries of the selected electrode material and blocks the oxygen in the resistive switching layer from diffusing out of the resistive switching layer and into and through the electrode. Maintaining the oxygen content within the MIM structure enhances the data retention and lifetime (endurance) of the memory element.

The electrical properties of MIM resistive switching device structures are selected to lower the power required to change the resistive switching layer from a low resistance state (LRS) to a high resistance state (HRS) and vice-versa. It is generally desirable to form the resistive switching layer so that its material and electrical properties will not degrade or breakdown during the often high current "burn-in" type device preparation steps, such as the "electrical forming" process, and also during normal repetitive operation of the nonvolatile resistive switching memory device.

Figure 1:
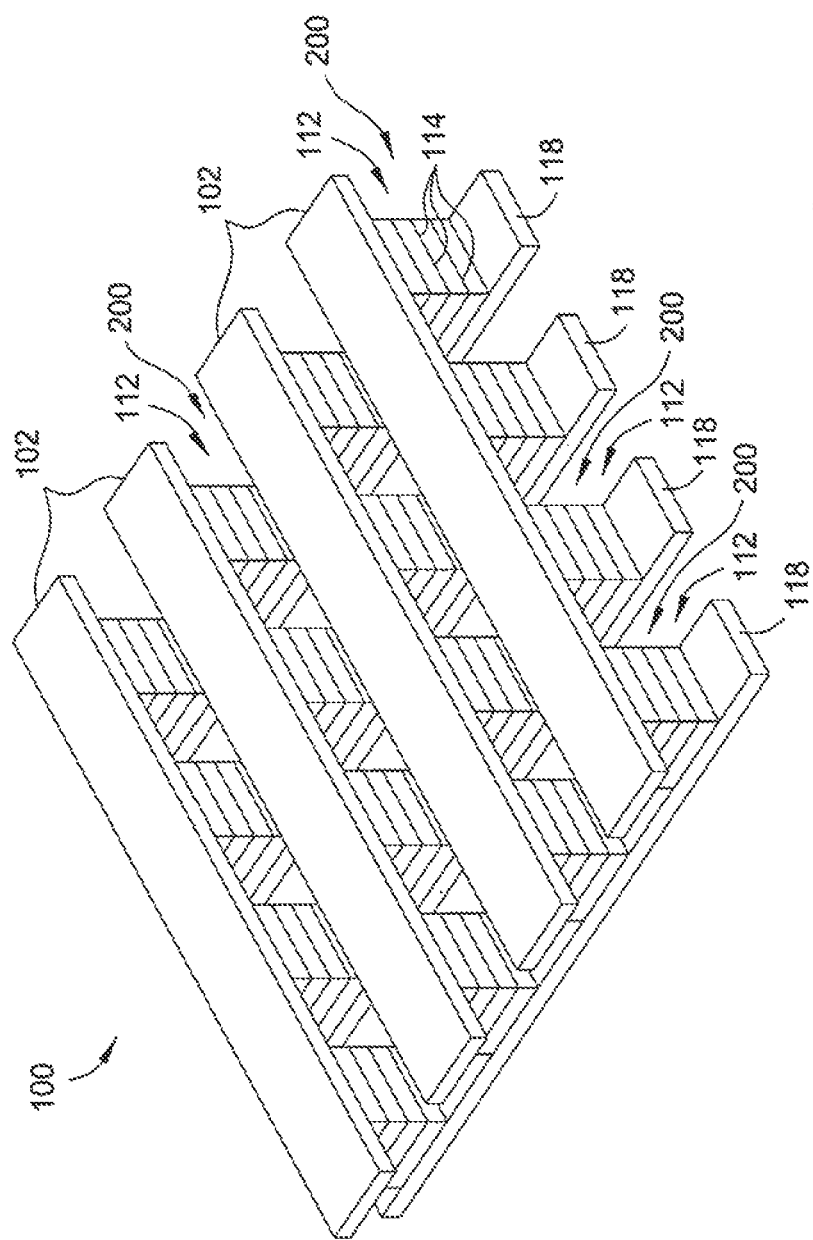
FIG. 1 is a perspective view of a memory array of memory devices.

A memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and bit-lines, or interconnect lines, which are referred to herein generally as electrodes 102 and 118, and are used to read from or write data into the memory devices 200. Electrodes 102 and 118 generally include one or more conductive layers, each conductive layer having a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the embodiments described herein.

Figure 2A:
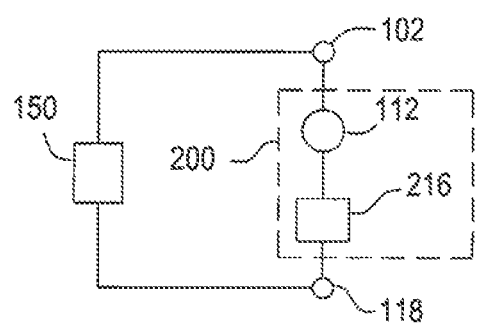
FIG. 2A is a schematic cross-sectional view of a memory device.

FIG. 2A schematically illustrates a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In some examples, the current steering device 216 may include two or more layers of semiconductor material, such as two or more doped silicon layers, that are configured to allow or inhibit the current flow in different directions through the memory element 112 when that memory element is not selected to read.

Figure 2B:
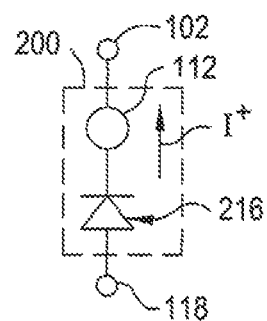
FIG. 2B schematically illustrates a memory device configured to allow current to flow through the memory device in a forward direction.

FIG. 2B schematically illustrates a switching memory device 200 that contains a memory element 112 and a diode type current steering device 216 that preferentially allows current to flow through the memory device 200 in a forward direction ("I$^+$"). However, due to the design of the current steering device 216, a reduced current can also flow in the opposing direction through the device by the application of a reverse bias to the electrodes 102 and 118.

Figure 2C:
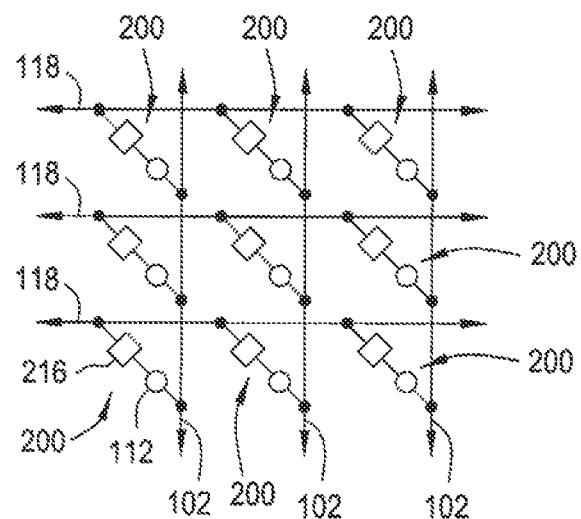
FIG. 2C is schematic representation of an array of memory devices.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, or interconnect lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 is formed.

Figure 2D:
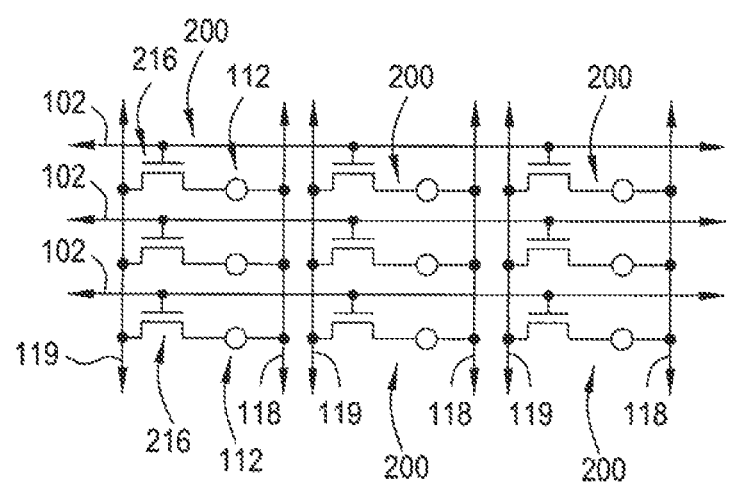
FIG. 2D is schematic representation of an array of memory devices.

FIG. 2D schematically illustrates an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted to provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 is formed.

During operation, such as a read operation, the state of a memory element 112 in the switching memory device 200 can be sensed by applying a sensing voltage (i.e., a "read" voltage $V_{READ}$ (FIG. 3)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of a memory element can be changed by application of suitable write signals to an appropriate set of electrodes 102 and 118.

Figure 3:
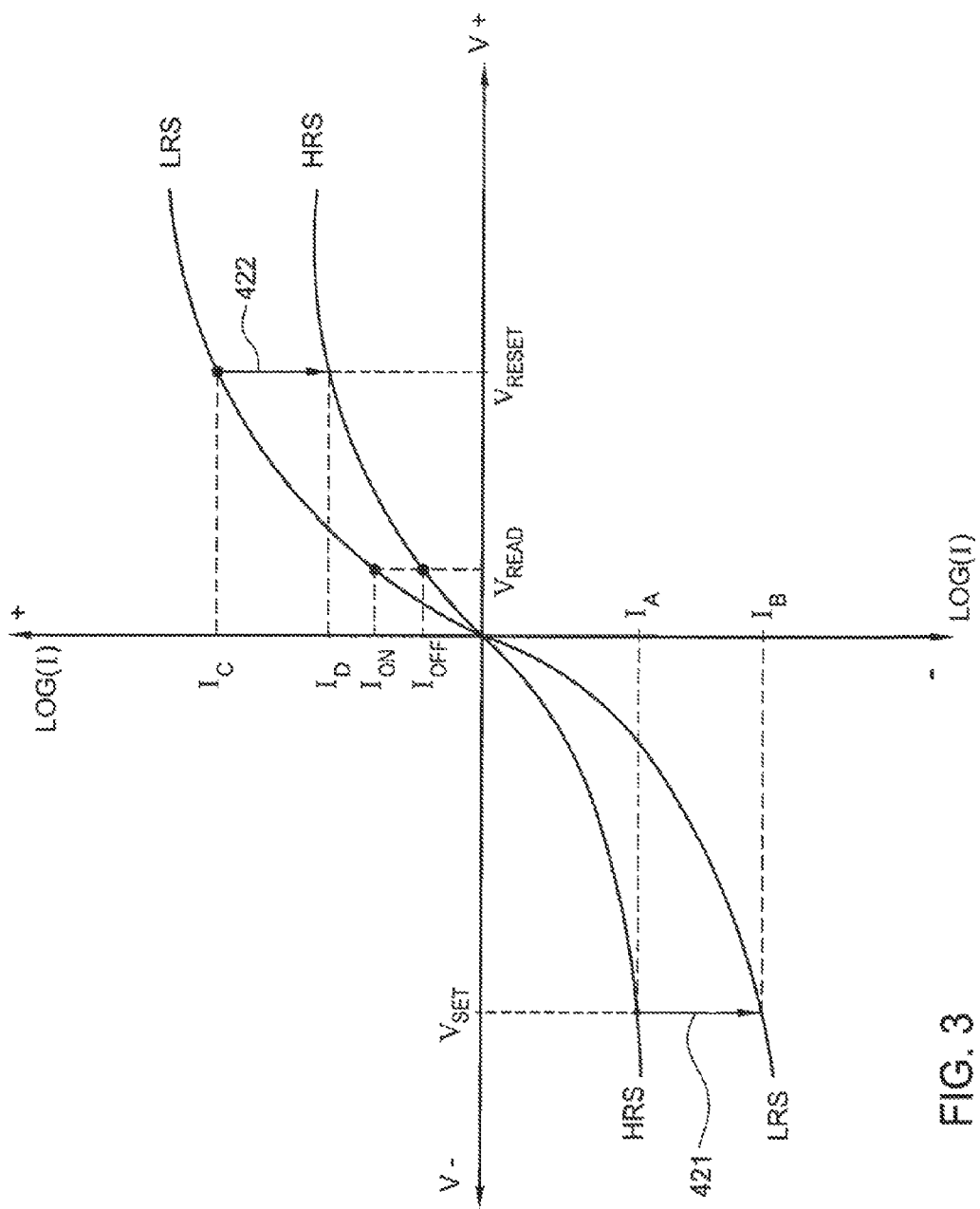
FIG. 3 is a graph illustrating the current (I) versus voltage (V) characteristics of the high and low resistance load lines of a resistive switching layer.

In some embodiments, the memory element 112 uses bipolar switching where opposite polarity set and reset voltages are used to alter the resistance of the memory element between high and low resistance states. FIG. 3 is a log-log plot of current (I) versus voltage (V) of one example of the low-resistance-state (LRS) and high-resistant-state (HRS) curves of a memory element 112 having these two bistable resistive states. The voltage levels $V_{SET}$ and $V_{RESET}$, shown in FIG. 3, illustrate typical threshold values used to "set" and "reset" the contents of a memory element 112. In some embodiments, initially, memory element 112 may be in a high resistance state (e.g., storing a logic "zero"). The high resistance state of memory element 112 can be sensed by read and write circuitry 150 (FIG. 2A) using electrodes 102 and 118. In some examples, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −1 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be facilitated by the redistribution or filling of traps (i.e., "trap-mediated") or defects in the resistive switching layer 206 (FIG. 4) of memory element 112, when the memory device 200 is reverse biased. The defects or traps, which are commonly thought to be oxygen vacancies, may be formed during the deposition and/or post-processing of the resistive switching layer 206. In some examples, the defects may be created by a non-stoichiometric material composition found in the formed resistive switching layer 206.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +1 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For some examples, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In some examples, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity.

Figure 4:
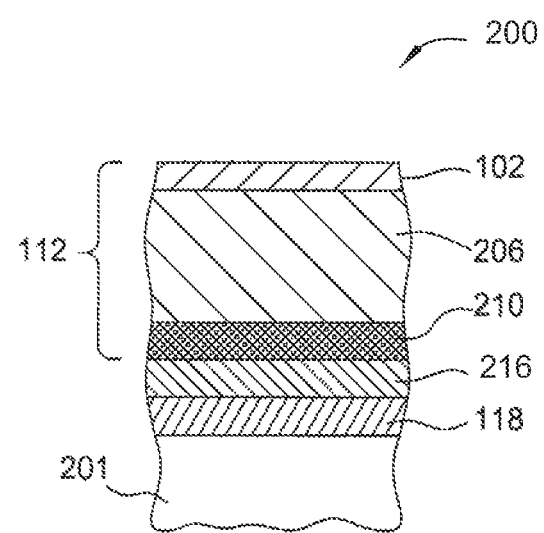
FIG. 4 is a schematic cross-sectional view of a memory element disposed in a nonvolatile memory device.

FIG. 4 is a schematic cross-sectional view of the layers of one example of some embodiments of a switching memory device 200, which contains a memory element 112 and a current steering device 216 (e.g., a diode) that is formed over a substrate 201. In this configuration, the memory element 112 generally contains a top electrode 102, resistive switching layer 206, and intermediate electrode 210.

The electrodes 102, 210 and 118 are generally formed from a conductive material, such as a highly conductive semiconductor material (e.g., p-type polysilicon, n-type polysilicon) and/or metals to minimize the circuit resistance created between interconnected devices in a memory array 100. Examples of metals selected for the electrodes 102, 210 and 118 include platinum, gold, ruthenium, iridium and nitrides such as titanium nitride, tantalum nitride, tantalum silicon nitride, tungsten nitride and hafnium nitride. The resistive switching layer 206 can be a dielectric material, such as a metal oxide material or other similar material that can facilitate the switching of memory element 112 between at least two or more stable resistive states. Examples of such metal oxide materials include tantalum oxide, lanthanum oxide, yttrium oxide, vanadium oxide, dysprosium oxide, niobium oxide, ytterbium oxide, tungsten oxide, hafnium oxide, aluminum oxide and zirconium oxide, among others.

Over time the oxygen may diffuse out of metal oxide materials of resistive switching layer 206, particularly during the application of a forming current and including normal operating currents across the memory element, thus changing the properties of the resistive switching layer 206 and limiting the useful life of the memory element. Because typical metal electrode materials are oxygen permeable, a metal electrode provides paths for the oxygen ions to pass from the resistive switching layer to and through the electrode and beyond the MIM structure. To limit oxygen diffusion, one or more of the electrodes (118, 210, 102) is doped with a dopant material (e.g., beryllium, boron, lithium, sodium and magnesium) that provide the electrode with enhanced oxygen-blocking or oxygen-repelling properties when compared to the same electrode materials without the dopant materials, thereby maintaining the oxygen ions within the metal oxide resistive switching layer 206 of memory element 200. Typical existing electrode materials have a grain structure, and the associated grain boundaries provide paths for the diffusion of oxygen ions, as it is believed that oxygen ions diffuse and move more easily to and through the electrode material along its grain boundaries. In other words, the grain boundaries within the electrode material provide for a diffusion rate of oxygen through the electrode material. Therefore, disposing a dopant over at least a portion of the grain boundaries binds these dopant materials providing oxygen blocking properties to the electrode material's grain boundaries and inhibiting the diffusion rate of oxygen by filling atom sized holes and voids along the grain boundaries which would otherwise provide a lower diffusion energy path for the movement of oxygen. The blocking of these paths "stuffs" the atom sized holes and voids in and along the grain boundaries and thereby inhibits the flow (movement) of oxygen ions along grain boundary paths. The stuffing of the atom sized holes and the low resistance to oxygen diffusion paths in and along grain boundaries of the electrode material with dopant traps the oxygen within the metal oxide resistive switching layer 206 and prevents oxygen depletion and the memory element's resulting performance degradation. Materials to be used as dopants that provide the electrode with enhanced oxygen-blocking/repelling properties include beryllium, boron, lithium, sodium and magnesium, or combinations thereof.

In some embodiments, the electrode may include a dopant material with a percent concentration of between 0.01 and 1.5 at. This concentration of the dopant materials enables the dopant to bond with the grain boundaries within the electrode material and block the lowest energy oxygen diffusion paths. For example, a titanium nitride deposited electrode may include a dopant with a concentration of 1.0 at. % of beryllium. In this example, the 1.0 at. % concentration of beryllium binds to the grain boundaries within the titanium nitride providing a blocking mechanism inhibiting the diffusion of the oxygen from the resistive switching layer 206. A higher concentration of a dopant within the electrode materials may result in phase segregation causing bonding and clumping of the dopant materials within the electrode, thereby reducing the efficiency of the oxygen-blocking properties. Phase segregation of the dopant would allow oxygen ions to pass along those grain boundaries that do not contain the dopant atoms. In addition, phase segregation of the dopant materials within the electrode may contribute to undesirably high resistance within the electrode. The dopant materials may be deposited contemporaneously and with the electrode materials by typical deposition techniques such as ALD, PVD and CVD providing uniform doping and distribution throughout the deposited electrode material.

Alternatively, the metal electrode material may be deposited by the typical deposition techniques as noted above, but the dopant materials may be added to the electrode metal material using ion implantation. Doping the metal electrode using ion implantation allows the depth of the dopant within the electrode to be controlled and tailored to enhance the switching characteristics. For example, an electrode that is 50 Å angstroms thick may only be doped to a depth of 5 Å on the side of the electrode opposite the resistive switching layer. By limiting the depth of the dopant materials, and as such, the oxygen-blocking properties within the electrode allows the oxygen ions from the metal oxide resistive switching layer to diffuse into a portion of the electrode without allowing the ions to pass completely through the electrode. It is believed that these ions create a pool or reservoir of stored oxygen ions that can be used to further enable and enhance the switching characteristics of the resistive switching element 200 as the availability of stored oxygen ions facilitate the switching of the metal oxide resistive switching layer 206 during normal operating cycles.

An electrode formed using a semiconductor material such as p-type polysilicon or an n-type polysilicon does not require the addition of a dopant to provide the electrode with oxygen-blocking properties as a silicon oxide layer is naturally formed when a polysilicon layer is adjacent to a metal oxide layer (resistive switching layer 206). The silicon oxide layer effectively acts as an oxygen-blocking layer and prevents any diffusion of the oxygen ions from migrating from the metal oxide resistive switching layer into or through the polysilicon layer.

Figure 5:
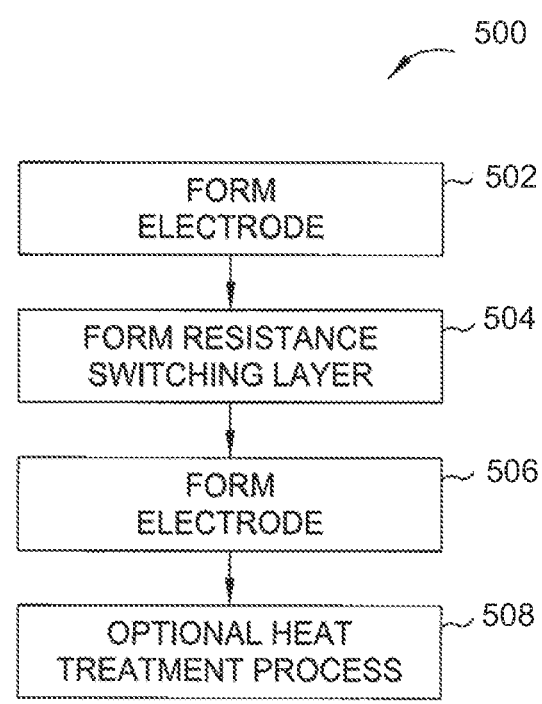
FIG. 5 shows a process for forming the switching memory device in FIG. 4.

FIG. 5 illustrates a process (method) 500 for forming an improved switching memory device 200 (FIG. 4). Although the method steps are described in conjunction with memory device 200 and in particular to an improved memory element 112, persons skilled in the art will understand that formation of other resistive switching memory devices using process 500 is possible. Note that the process for forming the current steering device is not shown in FIG. 5.

Process 500 begins at step 502 in which a first electrode is formed on or over substrate 201, which may be electrode 118 or intermediate electrode 210. In some embodiments, the first layer formed is an electrode, such as the bottom electrode 118 or intermediate electrode 210 shown in FIG. 4. The electrodes 102, 210 and 118, although generally formed from a conductive material, such as a highly conductive semiconductor material (e.g., p-type polysilicon, n-type polysilicon) and/or metal (e.g., platinum, gold, ruthenium, iridium and nitrides such as titanium nitride, tantalum nitride, tantalum silicon nitride, tungsten nitride, hafnium nitride), for an improved memory device 200 when formed from a metal may be doped with a material (e.g., beryllium, boron, lithium, sodium and magnesium, or combinations thereof) that enhances the electrode's oxygen-blocking properties. In some embodiments, electrodes 118 and/or 210 are formed using platinum doped with beryllium on or over substrate 201 using a conventional CVD, PVD or ALD type deposition technique. In some embodiments, electrode 118 and/or electrode 210 comprises platinum with beryllium included as a dopant, and is between about 50 Å and about 5000 Å thick. Alternatively, in some embodiments, electrodes 118 and/or 210 may be formed by depositing platinum about 50 Å angstroms thick using an ALD process and adding beryllium as a dopant to a depth of 5 Å using an implantation process.

In step 504, resistive switching layer 206 is formed on or over the first electrode, such as electrode 118 or intermediate electrode 210, using one or more deposition processes. Resistive switching layer 206 comprises a dielectric material that can be switched between two or more stable resistive states. In some embodiments, resistive switching layer 206 may comprise hafnium oxide and be about 50 Å, for some examples from about 20 Å to about 300 Å.

Referring to FIGS. 4 and 5, at step 504, the resistive switching layer 206 is formed on or over the first electrode, such as electrode 118 or intermediate electrode 210, and is deposited using a PVD, CVD or ALD deposition process. The resistive switching layer 206 may comprise a metal oxide layer, such as tantalum oxide, lanthanum oxide, yttrium oxide, vanadium oxide, dysprosium oxide, niobium oxide, ytterbium oxide, tungsten oxide, hafnium oxide, aluminum oxide and zirconium oxide. The resistive switching layer 206 may be formed to a thickness of between about 20 Å and about 100 Å angstroms, such as between about 20 Å and about 50 Å. The resistive switching layer 206 can be deposited using any desired technique, but in some embodiments may be deposited using an ALD process. In some examples, an ALD process using tetrakis(dimethylamino)hafnium (TDMAH) and an oxygen containing precursor (e.g., water vapor) at a temperature of about 250° C. is used to form a 30 Å thick hafnium oxide layer which acts as the resistive switching layer 206.

In step 506, (a second) electrode 102 is formed above resistive switching layer 206, as shown in FIG. 4, using one or more of the materials that are discussed above with regards to electrodes 118 or 210. Electrode 102 may be formed using a deposition process, such as a PVD, CVD, ALD or other similar process. In some embodiments, electrode 102 is between about 100 Å and 1 μm thick. As described above with regards to step 502 and the formation of electrode 118 or 210, and now again with the deposition of a metal top electrode 102, the metal may include a dopant material (e.g., beryllium, boron, lithium, sodium and magnesium, or combinations thereof) that provides the electrode with enhanced oxygen-blocking properties. In some embodiments, electrode 102 is formed using titanium nitride doped with beryllium on or over resistive switching layer 206 using a conventional PVD type deposition technique. In some embodiments, electrode 102 comprises titanium nitride doped with beryllium, and is between about 50 Å and about 5000 Å thick. Alternatively, in some embodiments, electrode 102 may be formed by depositing titanium nitride using an ALD process and doping the titanium nitride with beryllium using an ion implantation process.

In optional step 508, the memory device 200 formed can be thermally processed, e.g., an anneal process, (optional heat treatment process). The temperature and duration specification for such an anneal process is a function of the configuration of memory device 200 as well as the (elemental) materials included in memory device 200. For example, in some embodiments, the anneal process takes place at a temperature of greater than about 200° C. In other embodiments, the anneal process takes place at a temperature of greater than about 600° C. In yet other embodiments, the anneal process takes place at a temperature of greater than about 1000° C. The duration of the anneal process can also vary greatly, e.g., varying between about 30 seconds and 20 minutes depending on the configuration of memory device 200. Furthermore, vacuum anneals, oxygen anneals, anneals using gas mixtures, such as a hydrogen/argon mixture, and other anneal processes known in the art fall may be used. Similarly, multiple thermal processing steps may be performed on memory device 200, for some examples, a thermal process may be performed during or after multiple steps of method 500. The process(es) performed at optional heat treatment process step 508, are generally configured to cause the layers in the switching memory device 200 to form one or more desirable material properties at the interface between adjacent layers as well as to activate and/or desirably process (heat treat) the other layers formed in the switching memory device. Advantageously, for an optimized memory element such as memory element 200, any oxygen diffusion caused by anneal (heat treatment) step 508 would be limited by the dopant materials in the electrode(s) which would trap any oxygen ions and prevent them from migrating from resistive switching layer 206 into and through the electrodes and away from the MIM structure.

Embodiments described provide for an optimized memory element using a metal electrode material including a dopant material to provide the electrode with enhanced oxygen-blocking properties to suppress diffusion of oxygen ions from the metal oxide resistive switching layer through the electrode. A memory element with enhanced electrode properties that maintains oxygen ions within the MIM structure provides for a ReRAM device with better data retention and longer device lifetime.

The foregoing embodiments are merely illustrative of the principles described and various modifications can be made by those skilled in the art without departing from the scope and spirit of the invention as defined by the claims that follow.

The invention claimed is:

1. A nonvolatile memory element, comprising:
   a first electrode layer;
   a second electrode layer; and
   a resistive switching layer disposed between the first electrode layer and the second electrode layer,
   wherein the first electrode directly interfaces the resistive switching layer,
   wherein the resistive switching layer comprises a metal oxide,
   wherein the first electrode layer comprises a nitride and a first dopant, wherein the first dopant comprises one or more of beryllium, boron, lithium, sodium, magnesium, or combinations thereof,
   wherein the first dopant is only present in a portion of the first electrode directly interfacing the resistive switching layer.

2. The nonvolatile memory element of claim 1, wherein the first electrode layer comprises one or more of titanium nitride, tantalum nitride, tantalum silicon nitride, tungsten nitride, or hafnium nitride.

3. The nonvolatile memory element of claim 1, wherein the portion of the first electrode comprising the first dopant has a thickness of 5 Å.

4. The nonvolatile memory element of claim 1, wherein the first dopant provides the electrode layer with enhanced oxygen-blocking properties when compared to the same electrode layer that does not comprise the dopant.

5. The nonvolatile memory element of claim 1, wherein a concentration of the first dopant is between 0.01 and 1.5 at. %.

6. The nonvolatile memory element of claim 1, wherein the first electrode layer includes a plurality of metal grains that have grain boundaries, and an amount of the first dopant is disposed over at least a portion of the grain boundaries.

7. The nonvolatile memory element of claim 1, wherein the second electrode layer comprises a second dopant.

8. The nonvolatile memory element of claim 7, wherein the first dopant and the second dopant comprise the same material.

9. The nonvolatile memory element of claim 1, wherein the metal oxide of the resistive switching layer is one of tantalum oxide, lanthanum oxide, yttrium oxide, vanadium oxide, dysprosium oxide, niobium oxide, ytterbium oxide, tungsten oxide, hafnium oxide, aluminum oxide or zirconium oxide.

10. The nonvolatile memory element of claim 1, wherein the nitride of the first electrode is titanium nitride.

11. The nonvolatile memory element of claim 10, wherein the first dopant is beryllium.

12. The nonvolatile memory element of claim 11, wherein a concentration of beryllium in the portion of the first electrode directly interfacing the resistive switching layer is 1.0 atomic %.

13. The nonvolatile memory element of claim 1, wherein a concentration of the first dopants in the portion of the first electrode directly interfacing the resistive switching layer is below a phase segregation level.

14. The nonvolatile memory element of claim 1, wherein the second electrode comprises polysilicon.

15. The nonvolatile memory element of claim 1, wherein the metal oxide of the resistive switching layer is hafnium oxide.

16. The nonvolatile memory element of claim 15, wherein a thickness of the resistive switching layer is between about 20 Angstroms and 300 Angstroms.

* * * * *